United States Patent
Pan et al.

(10) Patent No.: US 9,312,336 B2
(45) Date of Patent: *Apr. 12, 2016

(54) MOSFET DEVICE WITH REDUCED BREAKDOWN VOLTAGE

(71) Applicant: Alpha and Omega Semiconductor Incorporated, Sunnyvale, CA (US)

(72) Inventors: Ji Pan, San Jose, CA (US); Anup Bhalla, Santa Clara, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 21 days.

This patent is subject to a terminal disclaimer.

(21) Appl. No.: 14/057,465

(22) Filed: Oct. 18, 2013

(65) Prior Publication Data

US 2014/0054687 A1    Feb. 27, 2014

Related U.S. Application Data

(63) Continuation of application No. 13/722,963, filed on Dec. 20, 2012, now Pat. No. 8,586,435, which is a continuation of application No. 12/317,629, filed on Dec. 23, 2008, now Pat. No. 8,362,552.

(51) Int. Cl.

| | |
|---|---|
| *H01L 29/76* | (2006.01) |
| *H01L 29/94* | (2006.01) |
| *H01L 31/062* | (2012.01) |
| *H01L 31/113* | (2006.01) |
| *H01L 31/119* | (2006.01) |
| *H01L 29/10* | (2006.01) |
| *H01L 29/08* | (2006.01) |
| *H01L 29/66* | (2006.01) |
| *H01L 29/78* | (2006.01) |
| *H01L 29/861* | (2006.01) |

(Continued)

(52) U.S. Cl.
CPC ...... *H01L 29/1037* (2013.01); *H01L 21/26513* (2013.01); *H01L 29/0878* (2013.01); *H01L 29/66128* (2013.01); *H01L 29/66143* (2013.01); *H01L 29/66727* (2013.01); *H01L 29/66734* (2013.01); *H01L 29/7806* (2013.01); *H01L 29/7811* (2013.01); *H01L 29/7813* (2013.01); *H01L 29/7827* (2013.01); *H01L 29/8611* (2013.01); *H01L 29/872* (2013.01); *H01L 29/8725* (2013.01); *H01L 21/26586* (2013.01); *H01L 29/1095* (2013.01); *H01L 29/41766* (2013.01); *H01L 29/4236* (2013.01); *H01L 29/47* (2013.01)

(58) Field of Classification Search
CPC .................... H01L 29/41766; H01L 29/4236; H01L 29/7813; H01L 29/66143; H01L 29/872
See application file for complete search history.

(56) References Cited

U.S. PATENT DOCUMENTS

| | | | | |
|---|---|---|---|---|
| 4,134,123 | A | * | 1/1979 | Shannon ................. 257/484 |
| 6,110,799 | A | * | 8/2000 | Huang ...................... 438/430 |

(Continued)

*Primary Examiner* — Howard Weiss
(74) *Attorney, Agent, or Firm* — Van Pelt, Yi & James LLP (57) ABSTRACT

A semiconductor device includes a drain region, an epitaxial layer overlaying the drain region, and an active region. The active region includes: a body disposed in the epitaxial layer; a source embedded in the body; a gate trench extending into the epitaxial layer; a gate disposed in the gate trench; a contact trench extending through the source and at least part of the body; a contact electrode disposed in the contact trench; and an implant disposed at least in part along a contact trench wall; and an epitaxial enhancement portion disposed below the contact trench and in contact with the implant.

12 Claims, 13 Drawing Sheets

(51) Int. Cl.
*H01L 29/872* (2006.01)
*H01L 21/265* (2006.01)
*H01L 29/417* (2006.01)
*H01L 29/423* (2006.01)
*H01L 29/47* (2006.01)

(56) References Cited

U.S. PATENT DOCUMENTS 8,362,552 B2 * 1/2013 Pan et al. .................. 257/331
2008/0246082 A1 * 10/2008 Hshieh ...................... 257/333

* cited by examiner

MOSFET DEVICE WITH REDUCED BREAKDOWN VOLTAGE

CROSS REFERENCE TO OTHER APPLICATIONS

This application is a continuation of co-pending U.S. patent application Ser. No. 13/722,963, now U.S. Pat. No. 8,568,435, entitled FABRICATION OF MOSFET DEVICE WITH REDUCED BREAKDOWN VOLTAGE filed Dec. 20, 2012 which is incorporated herein by reference for all purposes, which is a continuation of U.S. patent application Ser. No. 12/317,629, now U.S. Pat. No. 8,362,552, entitled MOSFET DEVICE WITH REDUCED BREAKDOWN VOLTAGE filed Dec. 23, 2008 which is incorporated herein by reference for all purposes.

BACKGROUND OF THE INVENTION

Modern semiconductor devices, such as Metal Oxide Semiconductor Field Effect Transistors (MOSFETs) are often high density devices with small feature sizes. For example, the wall-to-wall pitch size of some MOSFETs in use today is on the order of 1-2 μms. As device size decreases, the thickness of gate oxide within the device also decreases and becomes more easily damaged during operation. The problem is more pronounced in power MOSFET devices, which often conduct high current and dissipate a large amount of power.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

A semiconductor device with reduced breakdown voltage is described. In some embodiments, a device includes an epitaxial layer enhancement portion disposed below the device's contact trench for reducing the breakdown voltage of the device. The epitaxial layer enhancement portion has the same carrier type as the epitaxial layer. Body contact implant or Shannon implant is optionally included.

Figure 1A:
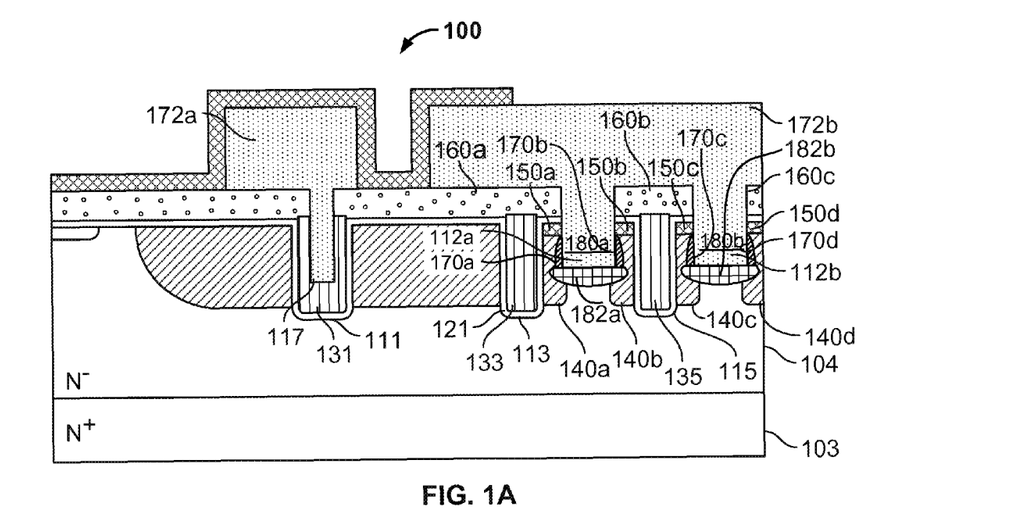
FIGS. 1A-1B are cross-sectional diagrams illustrating embodiments of double-diffused metal oxide semiconductor (DMOS) devices with reduced breakdown voltage.

FIG. 1A is a cross-sectional diagram illustrating an embodiment of a double-diffused metal oxide semiconductor (DMOS) device with reduced breakdown voltage. In this example, device 100 includes a drain that is formed on the back of an $N^+$-type semiconductor substrate 103. The drain region extends into an epitaxial (epi) layer 104 of $N^-$-type semiconductor that overlays substrate 103. Gate trenches such as 111, 113, and 115 are etched in epi layer 104. A gate oxide layer 121 is formed inside the gate trenches. Gates 131, 133 and 135 are disposed inside gate trenches 111, 113 and 115, respectively, and are insulated from the epi layer by the oxide layer. The gates are made of a conductive material such as polycrystalline silicon (poly) and the oxide layer is made of an insulating material such as thermal oxide. Specifically, gate trench 111 is located in a termination region disposed with a gate runner 131 for connection to gate contact metal. For that purpose gate runner trench 111 may be wider and deeper compared to active gate trenches 113 and 115. Furthermore, the spacing between the gate runner trench 111 from the active trench next to it, in this case trench 113, may be larger than the spacing between the active gate trenches 113 and 115.

Source regions 150a-d are embedded in body regions 140a-d, respectively. The source regions extend downward from the top surface of the body into the body itself. While body regions are implanted along side of all gate trenches, source regions are only implanted next to active gate trenches and not gate runner trenches. In the embodiment shown, gates such as 133 have a gate top surface that extends substantially above the top surface of the body where the source is embedded. Such a configuration guarantees the overlap of the gate and the source, allowing the source region to be shallower than the source region of a device with a recessed gate, and increases device efficiency and performance. The amount by which the gate poly top surface extends above the source-body junction may vary for different embodiments. In some embodiments, the gates of the device do not extend above the top surface of the source-body region.

During operation, the drain region and the body regions together act as a diode, referred to as the body diode. A dielectric material layer 160 is disposed over the gate to insulate the gate from source-body contact. The dielectric material forms insulating regions such as 160a-c on top of the gates as well as on top of the body and source regions. Appropriate dielectric materials include thermal oxide, low temperature oxide (LTO), boro-phospho-silicate glass (BPSG), etc.

A number of contact trenches 112a-b are formed between the active gate trenches near the source and body regions. These trenches are referred to as active region contact trenches since the trenches are adjacent to the device's active region that is formed by the source and body regions. For example, contact trench 112a extends through the source and the body, forming source regions 150a-b and body regions 140a-b adjacent to the trench. In contrast, trench 117, which is formed on top of gate runner 131, is not located next to an active region, and therefore is not an active region contact trench. Trench 117 is referred to as a gate contact trench or gate runner contact trench since a metal layer 172a connected to the gate signal is deposited within the trench. Gate signal is fed to active gates 133 and 135 through interconnections between trenches 111, 113 and 115 in the third dimension (not shown). Metal layer 172a is separated from metal layer 172b, which connects to source and body regions through contact trenches 112a-b to supply a power source. In the example shown, the active region contact trenches and gate contact trench have approximately the same depth.

In the example shown, regions such as 170a-d within the body and along the walls of the active region contact trench are heavily doped with P type material to form $P^+$-type regions referred to as body contact implants. The body contact implants are included to ensure that Ohmic contact is formed between the body and the source metal therefore the source and the body have the same potential.

A conductive material is disposed in contact trenches 112a-b as well as gate contact trench 117 to form contact electrodes. In the active region, the contact electrodes and the drain region form Schottky diodes that are in parallel with the body diode. The Schottky diodes reduce the body diode's forward voltage drop and minimize the stored charge, making the MOSFET more efficient. A single metal that is capable of simultaneously forming a Schottky contact to the $N^-$ drain and forming good Ohmic contact to the $P^+$ body and $N^+$ source is used to form electrodes 180a-b. Metals such as titanium (Ti), platinum (Pt), palladium (Pd), tungsten (W) or any other appropriate material may be used. In some embodiments, metal layer 172 is made of aluminum (Al) or made of a Ti/TiN/Al stack.

In conventional power MOSFET devices, the breakdown voltage of the Schottky diode formed between the contact electrode and the drain is typically as high as the breakdown voltage of the body diode. In such devices, before breakdown occurs, a large electric field may build up around the bottom of the gate and cause damage to the gate oxide. In device 100, the breakdown voltage of the device is reduced by implanting dopants having the same carrier type as the epitaxial layer below contact trenches 112a and 112b. The resulting epi enhancement portions (also referred to as breakdown voltage reducing implants) 182a and 182b have the same carrier type as the epitaxial layer but at a higher concentration. In this example, the carrier type of the epi is N-type (i.e., electrons are the majority carriers and holes are the minority carriers), and the epi enhancement portions are also N-type. In embodiments where the carrier type of the epi is P-type (i.e., electrons are the minority carriers and holes are the majority carriers), the epi enhancement implants are also P-type. The epi enhancement implants reduce the breakdown voltage of the Schottky diode formed between the contact electrode and the drain. Since the Schottky diode is in parallel with the body diode and has a lower breakdown voltage, the overall breakdown voltage of the device is reduced. In the event of a high electric field buildup, the Schottky diode breakdowns first and conducts current to dissipate the charges, thus preventing the electric field from causing damage to the gate oxide. The formation of the epi enhancement implants is discussed in greater detail below. The thickness and concentration of the epi enhancement implants depends on the desired breakdown voltage since thicker or more concentrated implants result in lower breakdown voltage. In one example, the breakdown voltage of the device is reduced from 38V to 22V with the inclusion of the epi enhancement portions.

Figure 1B:
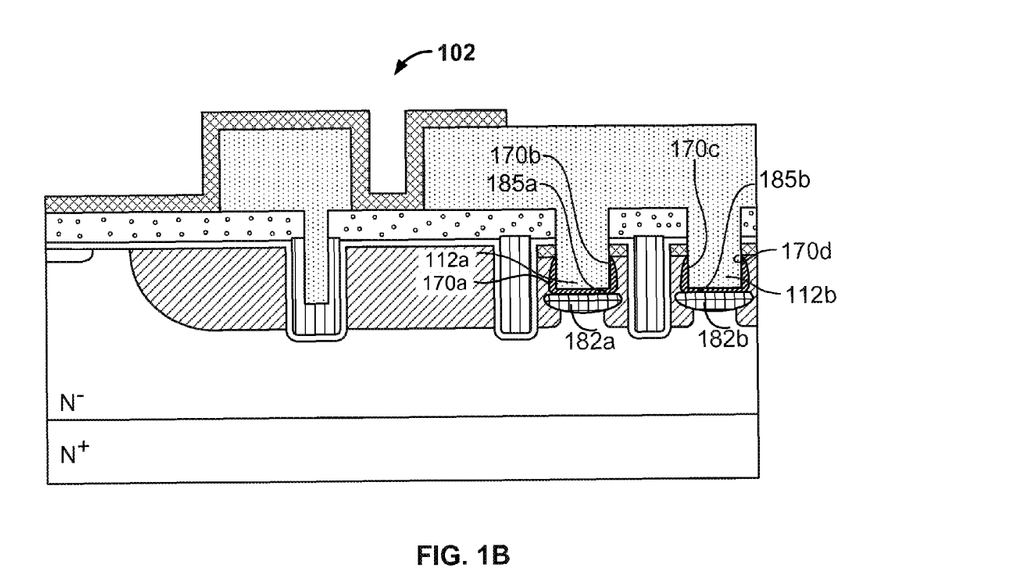

FIG. 1B is a cross-sectional diagram illustrating an embodiment of a DMOS device with reduced breakdown voltage. In this example, device 102 is similar to device 100, except that thin layers of P− material 185a and 185b are formed immediately below contact trenches 112a and 112b, respectively. Instead of forming Schottky diodes, low injection diodes are formed at the body/drain junctions below the bottoms of contact trenches 112a and 112b. These layers of P− material increase the forward voltage drop ($V_{fd}$) of the low injection diodes and reduce the leakage current, and are therefore referred to as the diode enhancement layers. As will be described in greater detail below, in some embodiments the diode enhancement layers are formed by the same processing steps that form the body contact implants. The dopant concentration of diode enhancement layer is much lower than that of body contact implant regions 170a-d such that at reversed bias the diode enhancement layer is completely depleted yet high enough that at forward bias it is not depleted. The thickness of the diode enhancement layers depends on the desired amount of low injection diode forward voltage as a thicker layer results in a higher forward voltage drop.

Similar to device 100, device 102 also includes implants with dopants having the same carrier type as the epitaxial layer. The resulting epi enhancement portions (also referred to as breakdown voltage reducing implants) 182a and 182b are formed below diode enhancement layers 185a and 185b, and have the same carrier type as the epitaxial layer but at a higher concentration to reduce the breakdown voltage of the low injection diodes thus preventing the electric field from causing damage to the gate oxide.

The embodiments shown above use N-type substrate (i.e., an $N^+$ silicon wafer with an $N^-$ epi layer grown on the wafer) as the drain of the device. In some embodiments, P-type substrate is used and the devices have N-type body contact implants and P-type epi enhancement layers.

Figure 2:
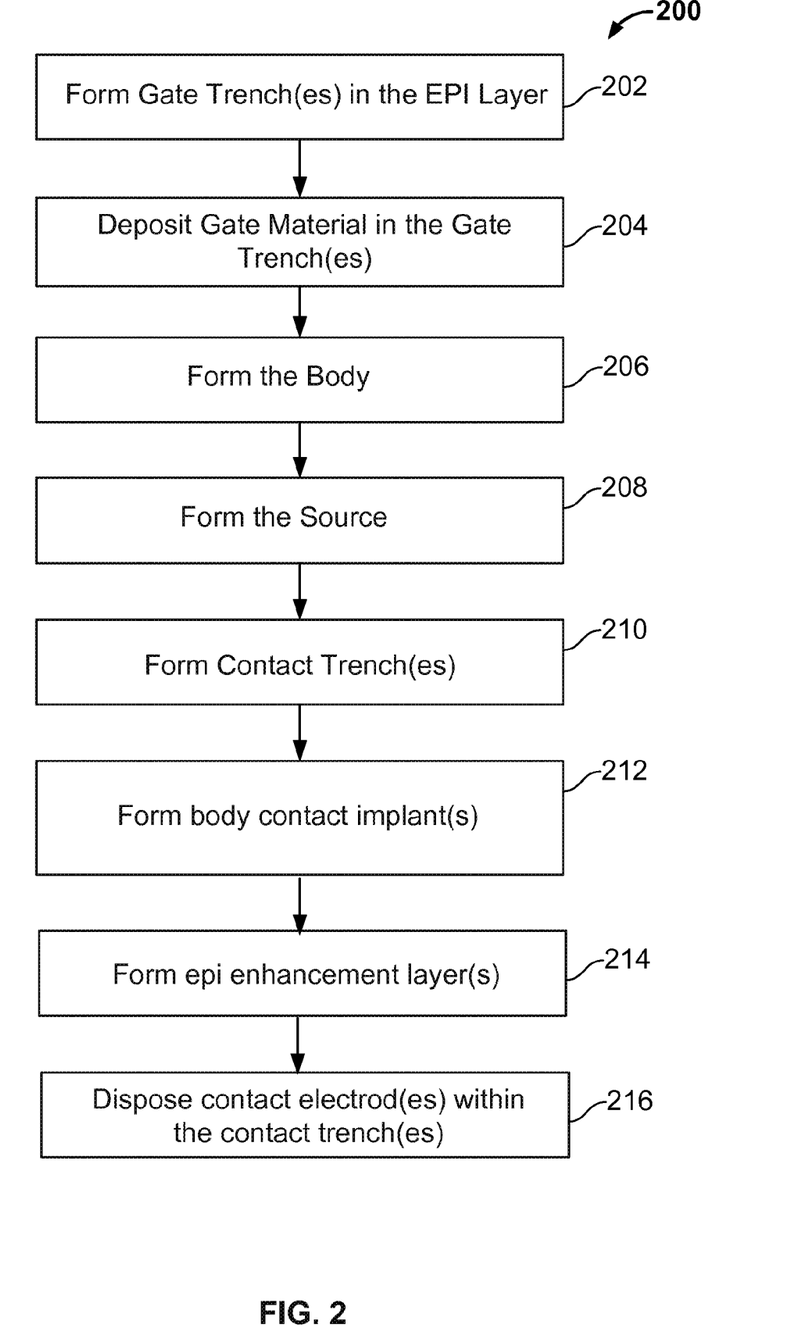
FIG. 2 is a flowchart illustrating an embodiment of a fabrication process for constructing a DMOS device.

FIG. 2 is a flowchart illustrating an embodiment of a fabrication process for constructing a DMOS device. At 202, gate trenches are formed in the epi layer overlaying the semiconductor substrate. At 204, gate material is deposited in the gate trenches. At 206, the body is formed. At 208, the source is formed. At 210, contact trenches are formed. At 212, body contact implants are formed. At 214, epi enhancement layers are formed. At 216, contact electrodes are disposed within the contact trenches. Process 200 and its steps can be modified to produce different embodiments of MOS devices such as 100 and 102 shown above.

Figure 3A:
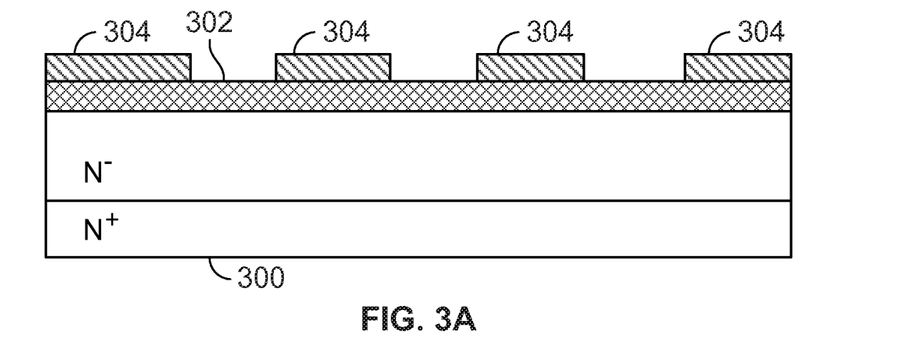
FIGS. 3A-3S are device cross-sectional views illustrating in detail an example fabrication process used for fabricating a MOSFET device.
Figure 3B:
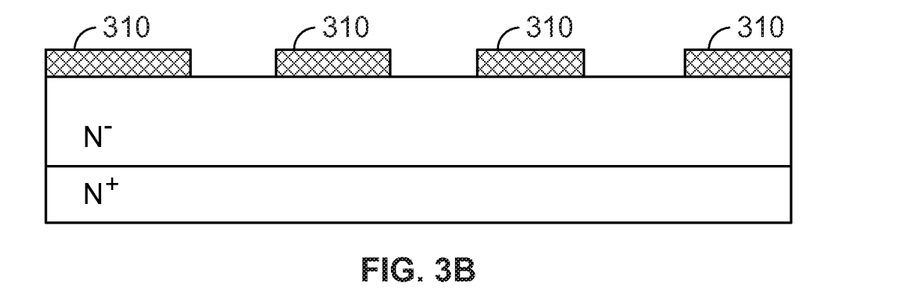
Figure 3C:
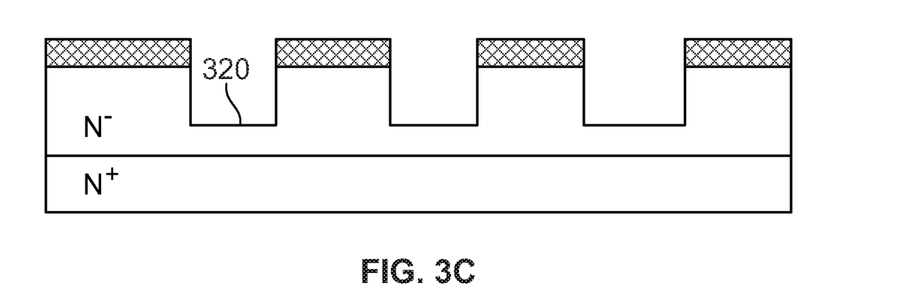
Figure 3D:
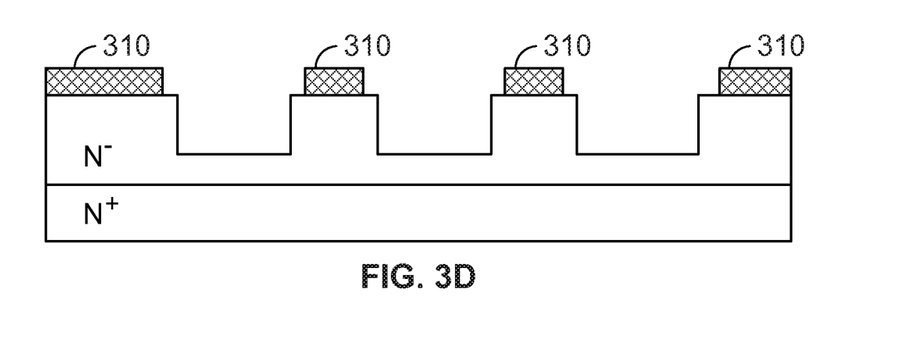
Figure 3E:
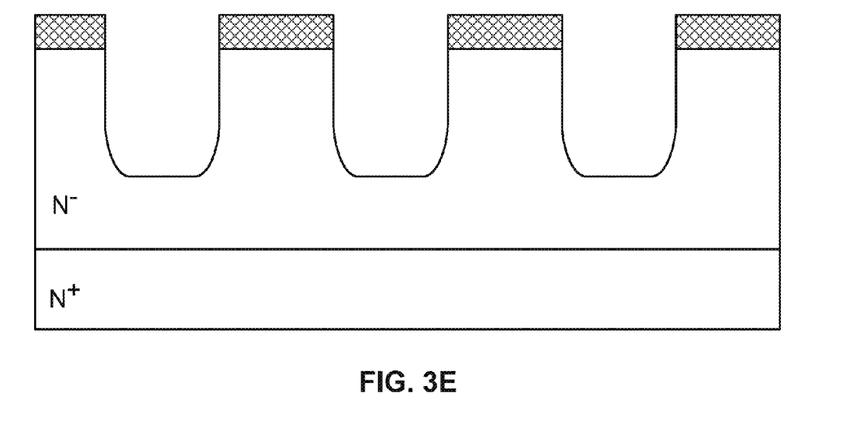
Figure 3F:
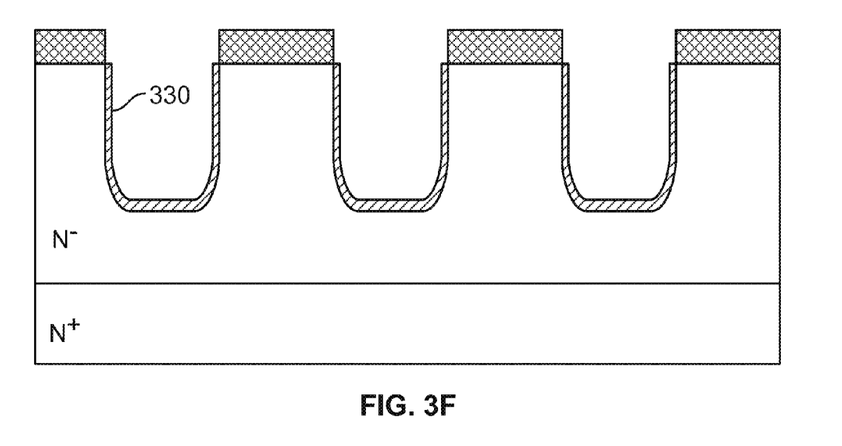
Figure 3G:
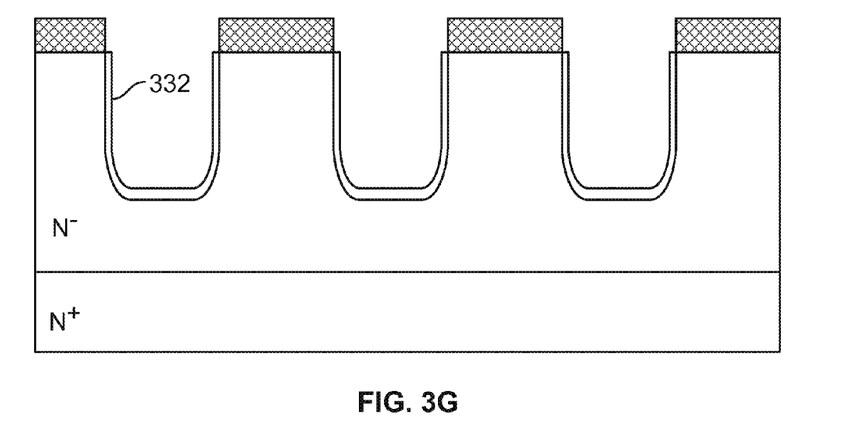
Figure 3H:
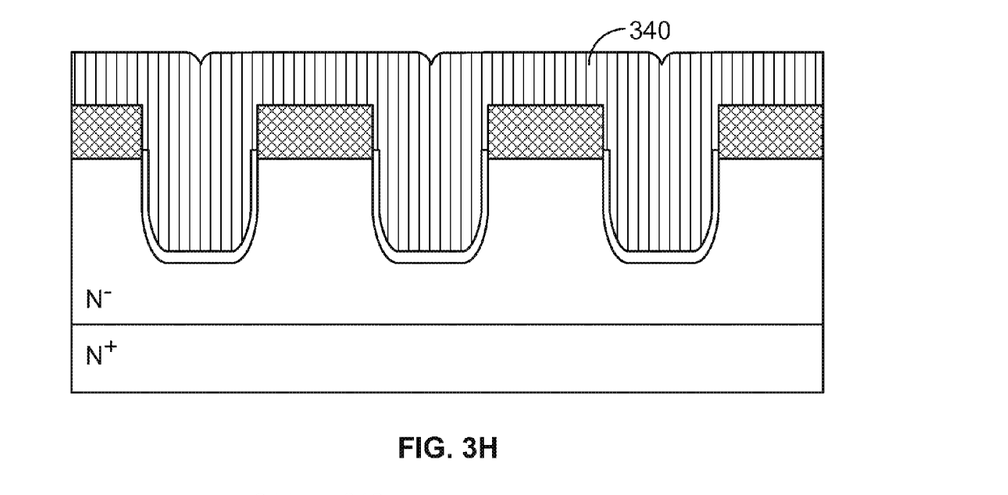
Figure 3I:
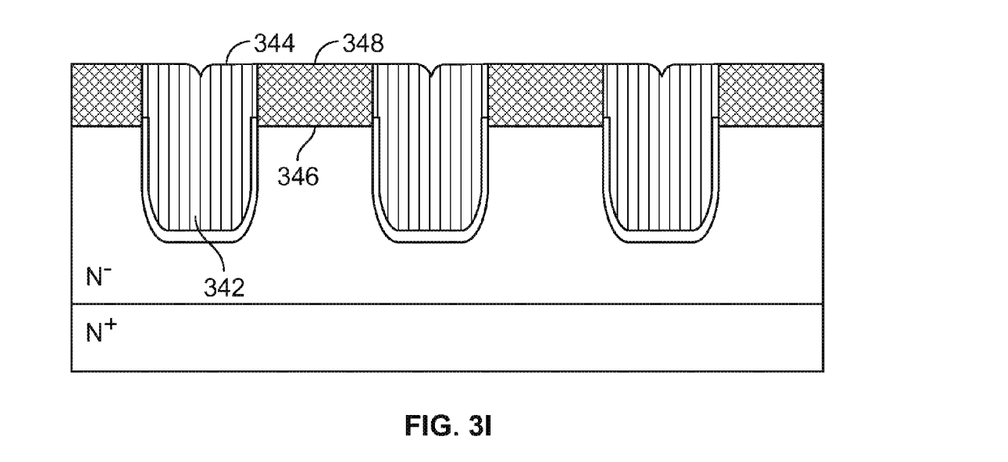
Figure 3J:
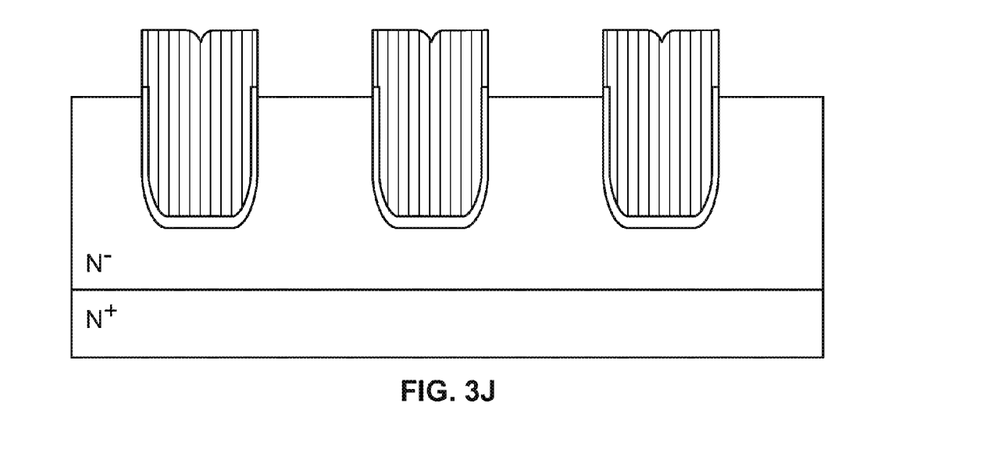
Figure 3K:
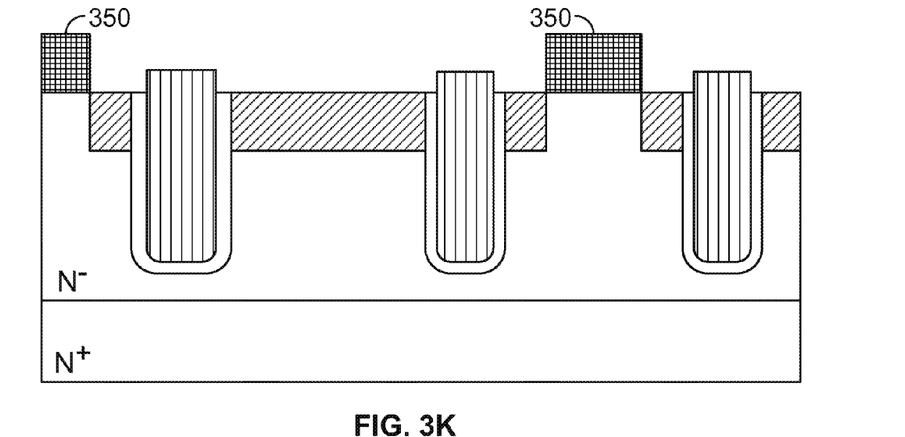
Figure 3L:
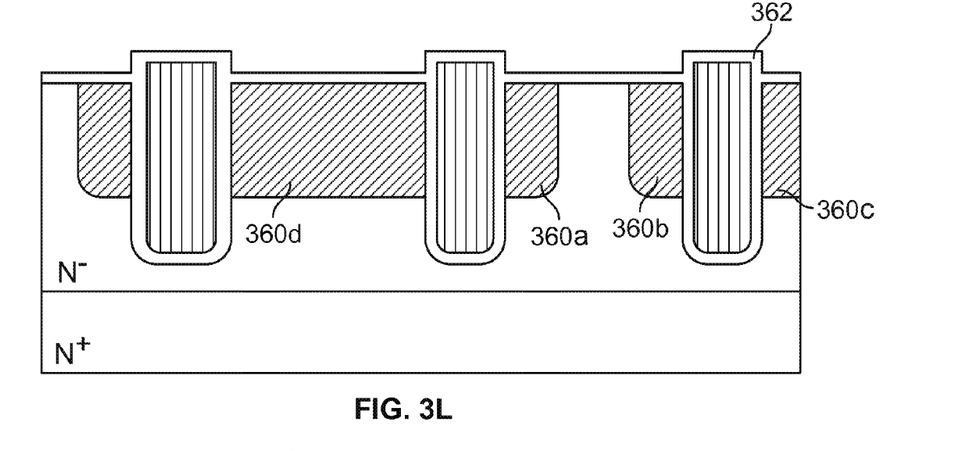
Figure 3M:
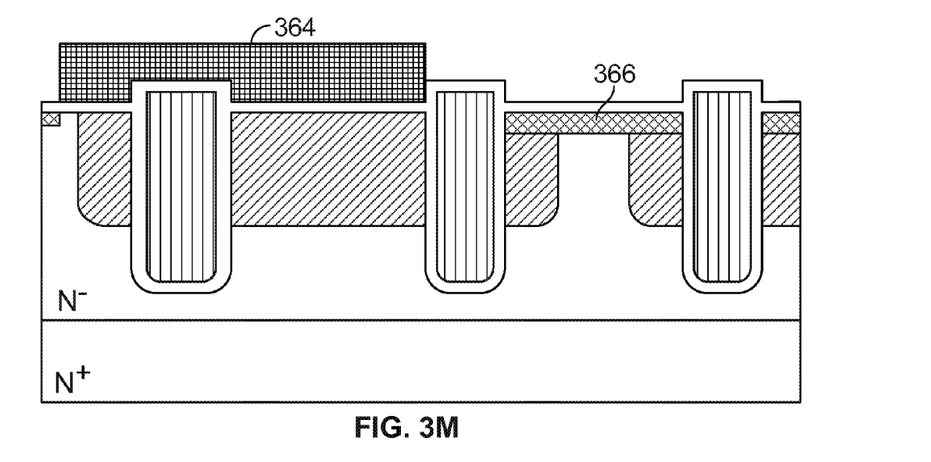
Figure 3N:
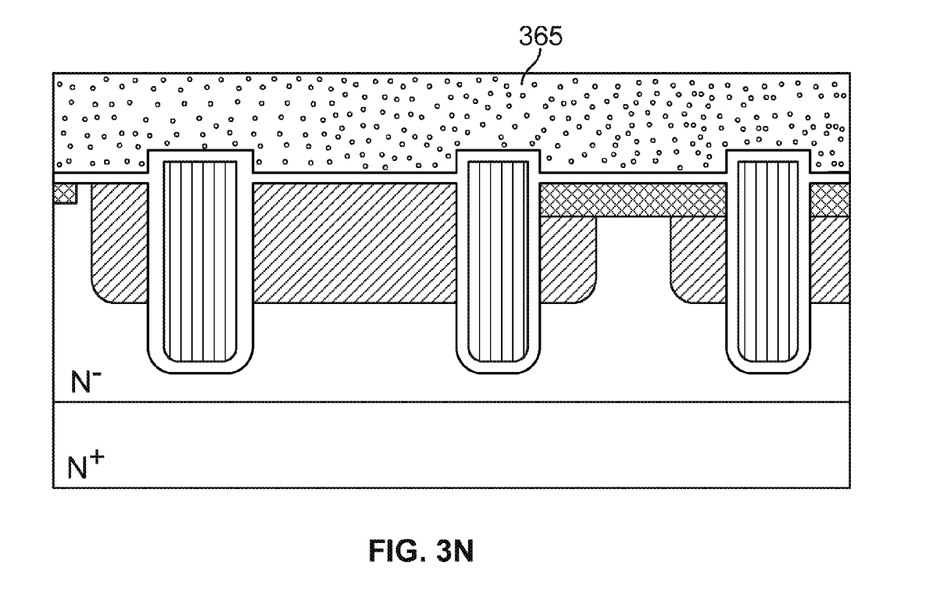
Figure 3O:
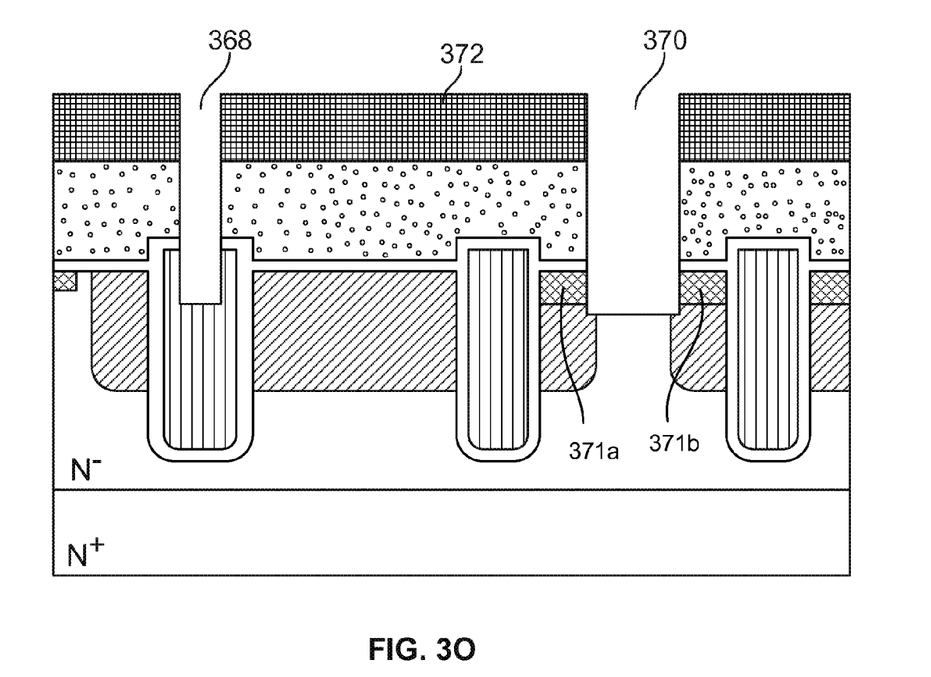
Figure 3P:
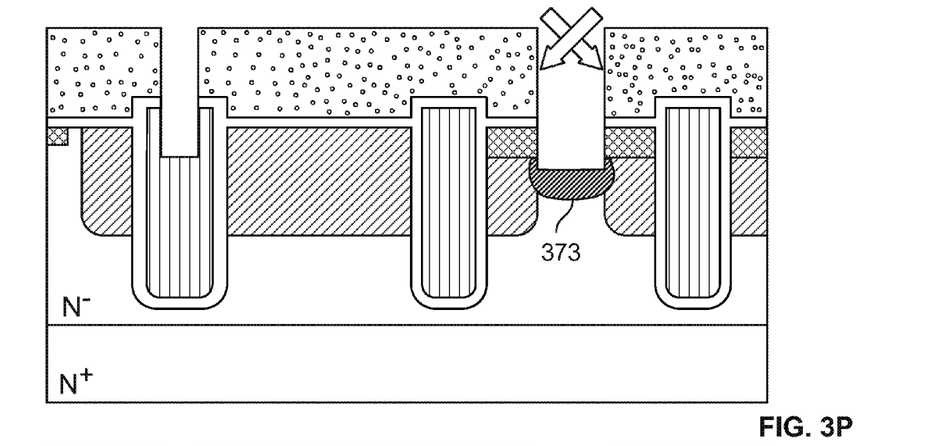
Figure 3Q:
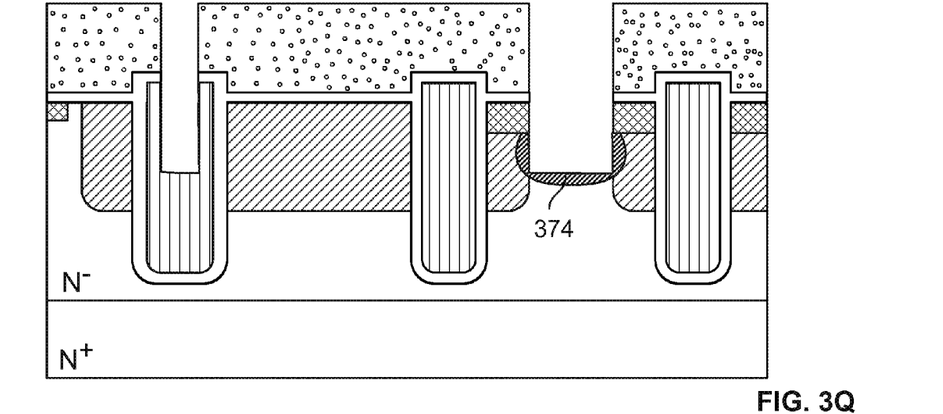
Figure 3R:
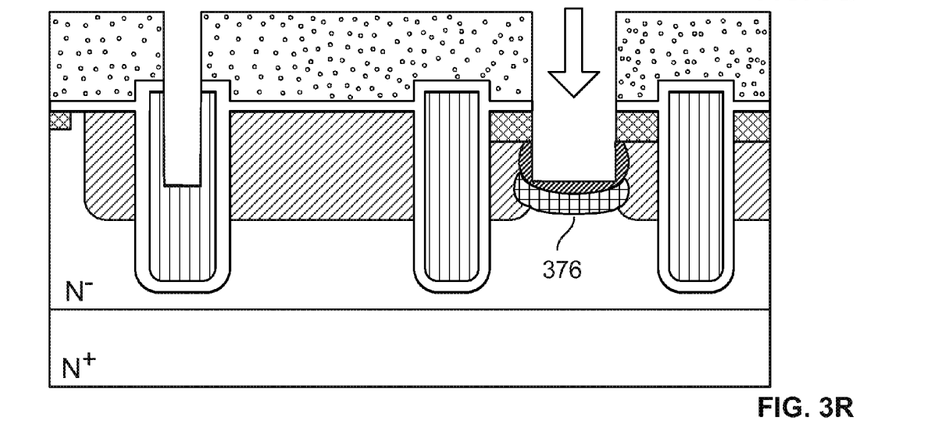
Figure 3S:
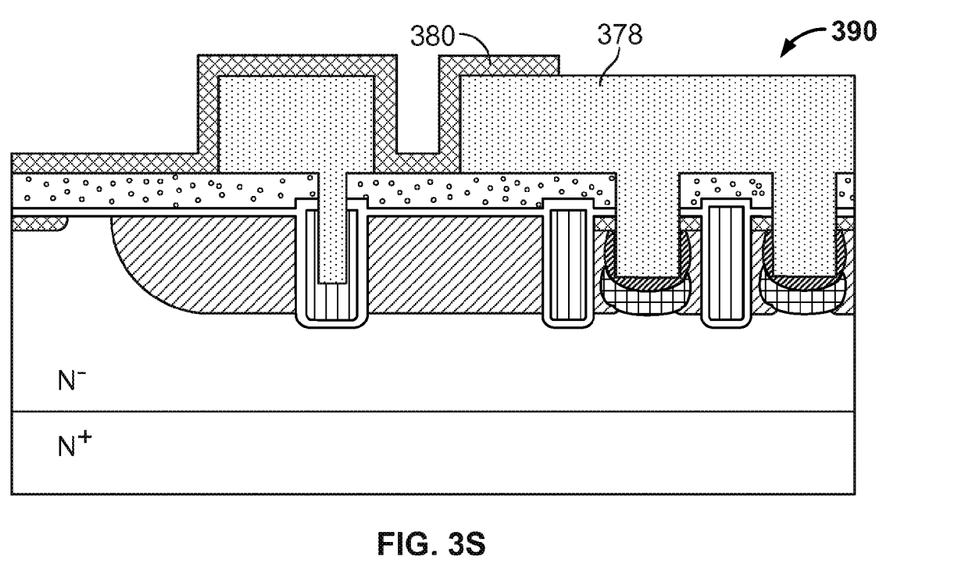

FIGS. 3A-3S are device cross-sectional views illustrating in detail an example fabrication process used for fabricating a MOSFET device. FIGS. 3A-3J shows the formation of the gates. In FIG. 3A, a $SiO_2$ layer 302 is formed on N-type substrate 300 by deposition or thermal oxidation. The thickness of the silicon oxide ranges from 100 Å to 30000 Å in various embodiments. Other thicknesses can be used. The thickness is adjusted depending on the desired height of the gate. A photoresist layer 304 is spun on top of the oxide layer and patterned using a trench mask.

In FIG. 3B, $SiO_2$ in the exposed areas is removed, leaving a $SiO_2$ hard mask 310 for silicon etching. In FIG. 3C, the silicon is etched anisotropically, leaving trenches such as 320. The gate material is deposited in the trenches. Gates that are later formed within the trench have sides that are substantially perpendicular to the top surface of the substrate. In FIG. 3D, $SiO_2$ hard mask 310 is etched back by an appropriate amount so that the trench walls remain approximately aligned with the edge of the hard mask after later etching steps. $SiO_2$ is the mask material used in this embodiment because etching using a $SiO_2$ hard mask leaves relatively straight trench walls that mutually align with the sides of the mask. Other material may be used as appropriate. Certain other types of material traditionally used for hard mask etching, such as $Si_3N_4$, may leave the etched trench walls with a curvature that is less desirable for gate formation in the following steps.

In FIG. 3E, the substrate is etched isotropically to round out the bottoms of the trenches. The trench is approximately between 0.5-2.5 μm deep and approximately between 0.2-1.5 μm wide in some embodiments; other dimensions can also be used. To provide a smooth surface for growing gate dielectric material, a sacrificial layer of $SiO_2$ 330 is grown in the trenches. This layer is then removed by the process of wet etching. In FIG. 3G, a layer of $SiO_2$ 332 is grown thermally in the trenches as dielectric material.

In FIG. 3H, poly 340 is deposited to fill up the trenches. In this case, the poly is doped to obtain the appropriate gate resistance. In some embodiments, doping takes place as the poly layer is deposited (in situ). In some embodiments, the poly is doped after the deposition. In FIG. 3I, the poly layer on top of the $SiO_2$ is etched back to form gates such as 342. At this point, top surface 344 of the gate is still recessed relative to top surface 348 of the $SiO_2$; however, top surface 344 of the gate may be higher than top layer 346 of the silicon, depending on the thickness of hard mask layer 310. In some embodiments, no mask is used in poly etch back. In some embodiments, a mask is used in poly etch back to eliminate the use of an additional mask in the following body implanting process. In FIG. 3J, the $SiO_2$ hard mask is removed. In some embodiments, dry etch is used for hard mask removal. The etching process stops when the top silicon surface is encountered, leaving the poly gate extending beyond the substrate surface where source and body dopants will be implanted. In some embodiments, the gate extends beyond the substrate surface by approximately between 300 Å to 20,000 Å. Other values can also be used. A $SiO_2$ hard mask is used in these embodiments since it provides the desired amount of gate extension beyond the Si surface in a controllable fashion. A screen oxide may then be grown across the wafer. The above processing steps may be simplified for fabricating devices with recessed gate poly. For example, in some embodiments a photoresist mask or a very thin $SiO_2$ hard mask is used during trench formation, and thus the resulting gate poly does not extend beyond the Si surface.

FIGS. 3K-3N illustrate the formation of the source and the body. In FIG. 3K, a photoresist layer 350 is patterned on the body surface using a body mask. The patterned photoresist layer is referred to as body block since the photoresist blocks dopants from being implanted in the masked regions. The unmasked regions are implanted with body dopants. Dopants such as Boron ions are implanted. In FIG. 3L, the photoresist is removed and the wafer is heated to thermally diffuse the implanted body dopants via a process sometimes referred to as body drive. Body regions 360a-d are formed. In some embodiments, the energy used for implanting the body dopants is approximately between 30-600 keV, the dose is approximately between $2\times10^{12}$-$4\times10^{13}$ ions/cm$^2$, and the resulting final body depth is approximately between 0.3-2.4 μm. Different depths can be achieved by varying factors including the implant energy, dose and diffusion temperature. An oxide layer 362 is formed during the diffusion process.

In FIG. 3M, a photoresist layer 364 is patterned using a source mask. In the embodiment shown, source mask 364 does not block any area between active trenches. In some embodiments, source mask 364 also blocks a center area between active trenches (not shown). The unmasked region 366 is implanted with source dopants. In this example, arsenic ions penetrate silicon in the unmasked areas to form $N^+$ type source. In some embodiments, the energy used for implanting the source dopants is approximately between 10-100 keV, the dose is approximately between $1\times10^{15}$-$1\times10^{16}$ ions/cm$^2$, and the resulting source depth is approximately between 0.05-0.5 μm. Further depth reduction can be achieved by varying factors such as the doping energy and dose. Other implant processes may also be used as appropriate. In FIG. 3N, the photoresist is removed and the wafer is heated to thermally diffuse the implanted source dopants via a source drive process. A dielectric (e.g. BPSG) layer 365 is disposed on the top surface of the device after source drive, and optionally densified in some embodiments.

FIGS. 3O-3T illustrate the formation of the contact trench and various implants. In FIG. 3O, a photoresist layer 372 is deposited on the dielectric layer and patterned using a contact mask. A first contact etch is performed to form trenches 368 and 370. The trench depth is determined at least in part on the thickness of the source implant since trench 370 is expected to cut through the source implant and form separate source regions 371a and 371b. In some embodiments, the depth of the first contact trench is between 0.2-2.5 μm approximately.

In FIG. 3P, the photoresist layer is removed, and the area around the bottom of trench is bombarded with implant ions to form body contact implant 373. Boron ions with a dose of approximately $1\times10^{15}$-$5\times10^{15}$ ions/cm$^2$ are implanted in some embodiments. The corresponding implant energy is approximately 10-60 keV. In some embodiments, $BF_2$ ions with a dose of approximately $1\times10^{15}$-$5\times10^{15}$ ions/cm$^2$ and implant energy of 40-100 keV are used. In some embodiments, both $BF_2$ and Boron are implanted to form the body contact implant. The implantation tilt is approximately between 0-45°. The implant is then thermally diffused.

In FIG. 3Q, a second contact etch takes place. Since the etching process does not affect the dielectric layer, the second contact etch does not require an extra mask. The depth of the second etch depends on how much of the body contact implant on the bottom of the trench should be removed, which in turn depends on the desired amount of increase in the forward voltage drop and corresponding decrease in leakage current. In some embodiments (such as device 100 of FIG. 1A), all the body contact implant on the bottom of the trench is removed, leaving only implants on the sidewalls. In some embodiments (such as device 102 of FIG. 1B and the device of FIG. 3Q), only a portion of the body contact implant in the trench bottom is removed, leaving a diode enhancement layer 374. A thicker diode enhancement layer results in higher Schottky forward voltage drop and lower leakage current. The depth of the contact trenches is increased by 0.2-0.5 μm in some embodiments.

In some embodiments, during the second contact etch, all the body contact implant on the bottom of the contact trench is removed. Dopants having opposite carrier type as the epi layer are optionally implanted to form a Schottky barrier controlling layer (also known as Shannon implant) in the bottom region of the contact trench. The Shannon implant is shallow and low dosage; therefore, it is completely depleted regardless of bias. The Shannon implant is used to control the Schottky barrier height, thus allowing for better control over the leakage current and improving the reverse recovery characteristics of the Schottky diode. Since the step of disposing the Shannon implant is optional it is not shown in the diagrams.

In FIG. 3R, an epi enhancement layer 376 is implanted. In this example, N-type dopants are used. In one embodiment where the N-type epi has a carrier concentration of $2\times10^{16}$ ions/cm$^3$, phosphorous ions with an energy level of approximately 40 keV and dosage level of approximately $8\times10^{12}$ ions/cm$^2$ are implanted. The implant layer is thermally diffused at 1050° c. for 30 seconds. The resulting epi enhancement layer has a thickness of approximately 0.15-0.4 μm and a concentration of approximately $5\times10^{16}$-$3\times10^{17}$ ions/cm$^3$. Different thicknesses can be achieved by varying factors including the implant energy, dose and diffusion temperature. A thicker or more concentrated epi enhancement layer results in greater reduction in the diode breakdown voltage.

Alternatively, the second contact etch may be omitted. In some embodiments, after contact implant is carried out in step 3P, the epi enhancement implantation may be formed by using implants with different energy and dosage combination. While the body contact implants in the contact trench sidewalls remain unaffected, the body contact implants in the contact trench bottom may be completely compensated for the formation of Schottky diodes or partially compensated to leave a thin layer of diode enhancement layer for the formation of low injection diodes. In one embodiment, an implant of phosphor ions with $6\times10^{12}$ ions/cm$^2$ dose at 200 keV is carried out followed with a second implant of phosphor ions with $2\times10^{12}$ ions/cm$^2$ at 100 keV to compensate a portion of body contact implant and to form the epi enhancement layer.

In FIG. 3S, completed device 390 is shown. Metal layer 378 is deposited, etched where appropriate, and annealed. Passivation openings are made after a passivation layer 380 is deposited. Additional steps required to complete the fabrication such as wafer grinding and back metal deposition are also performed.

Figure 4K:
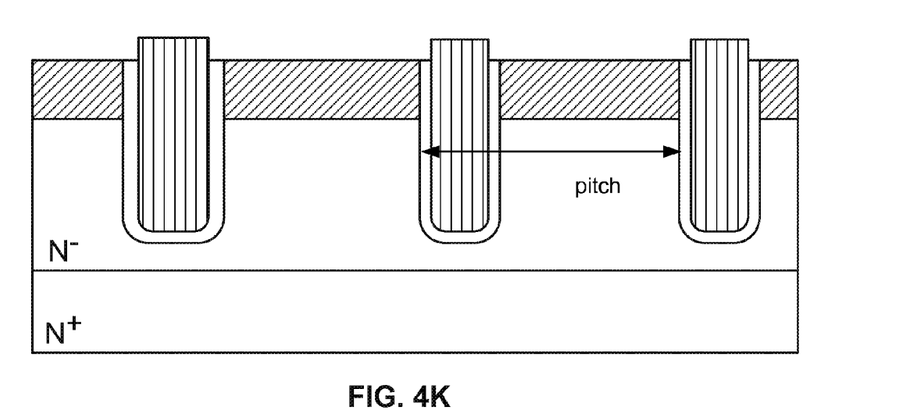
FIGS. 4K-4S are device cross-sectional views illustrating in detail another example fabrication process used for fabricating a MOSFET device.
Figure 4L:
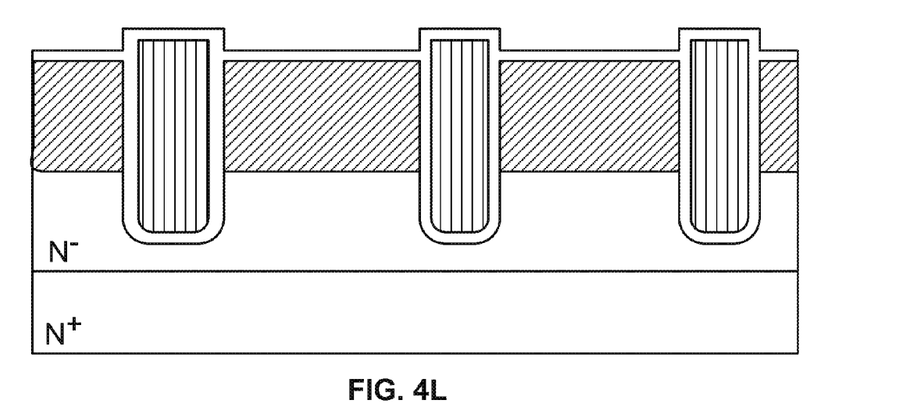
Figure 4M:
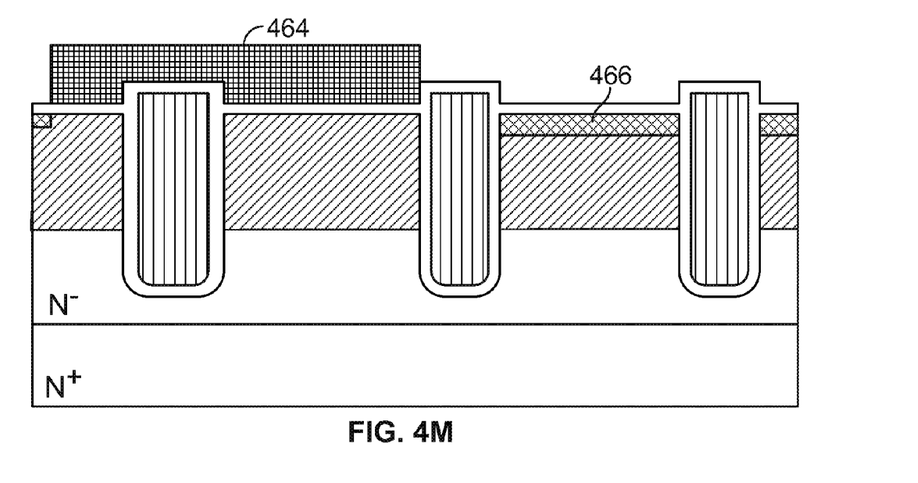
Figure 4N:
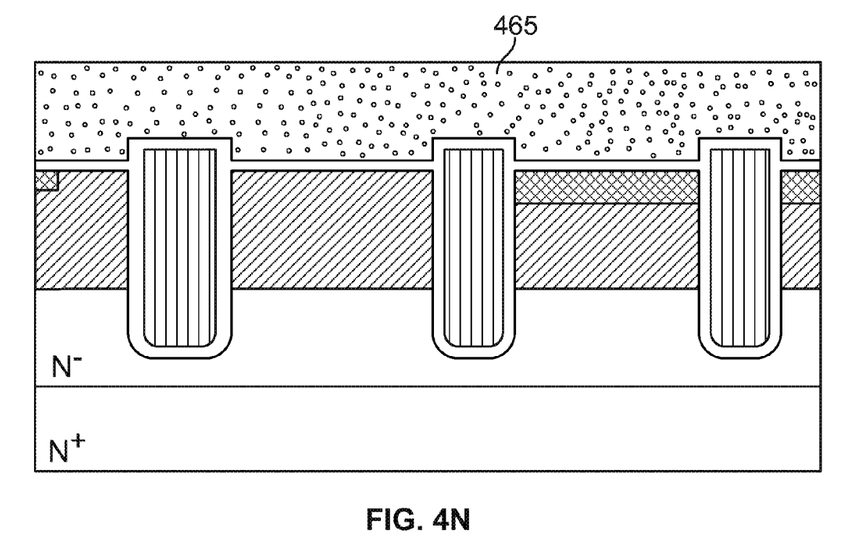

FIGS. 4K-4S are device cross-sectional views illustrating in detail another example fabrication process used for fabricating a MOSFET device. This process is sometimes used to fabricate devices with small wall-to-wall pitch size. In this example, it is assumed that the steps shown in FIGS. 3A-3J have already been performed to form the gates. Since the pitch size is so small that a photoresist body block such as 350 of FIG. 3K cannot be easily formed, no photoresist body block is used in the process shown in FIGS. 4K-4R. In FIG. 4K, a layer of body dopants is implanted without requiring a photoresist body block. The wall-to-wall pitch size of the device shown in this example is on the order of 1.4 μm or less. In FIG. 4L, the body dopants are thermally diffused. In FIG. 4M, a layer of photoresist forms a source block 464. A layer of source dopants 466 is implanted. In FIG. 4N, the photoresist is removed and the source dopants are thermally diffused. A dielectric (e.g. BPSG) layer 465 is disposed on the top surface of the device after source drive, and optionally densified in some embodiments.

Figure 4O:
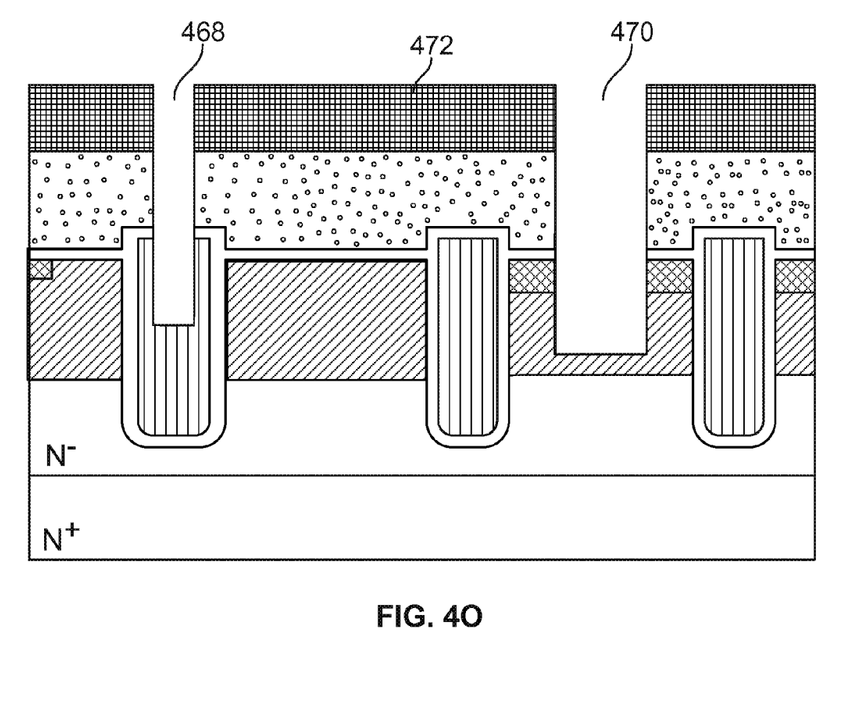
Figure 4P:
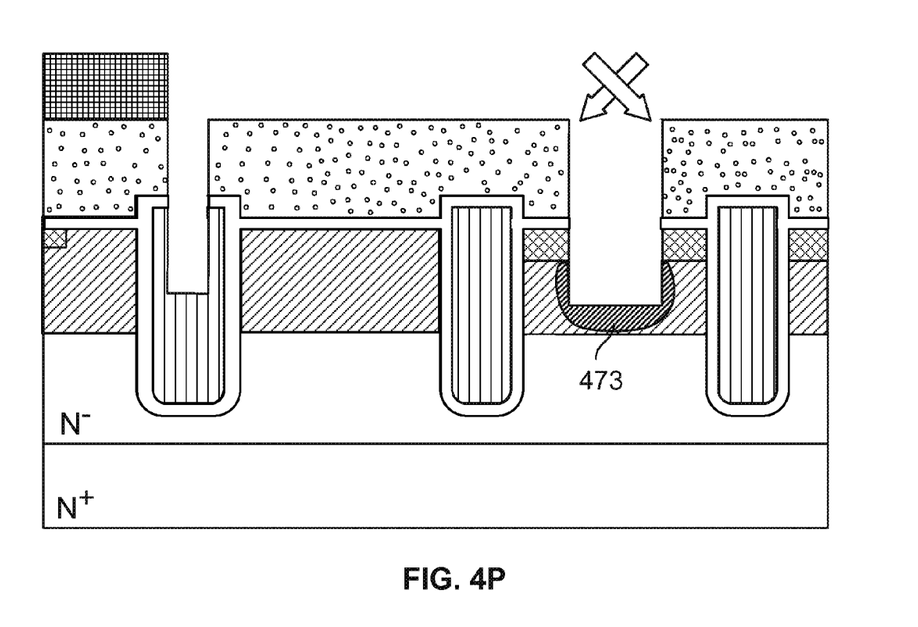

FIGS. 4O-4S illustrate the formation of the contact trench and various implants. In FIG. 4O, a photoresist layer 472 is deposited on the dielectric layer and patterned using a contact mask. A first contact etch is performed to form trenches 468 and 470. The source layer is etched through, forming separate source regions. A substantial portion of the body layer is also removed. In FIG. 4P, the photoresist layer is removed, and the sidewall around the bottom of trench is bombarded with implant ions to form body contact implant 473. In some embodiments, Boron ions with a dose of approximately $1\times10^{15}$-$5\times10^{15}$ ions/cm$^2$ are implanted and the implant energy is approximately 10-60 keV. In some embodiments, BF$_2$ ions with a dose of approximately $1\times10^{15}$-$5\times10^{15}$ ions/cm$^2$ and implant energy of 40-100 keV are used. In some embodiments, both BF$_2$ and Boron are implanted to form the body contact implant. The implantation tilt is approximately between 0-45°. The implant is then thermally diffused.

Figure 4Q:
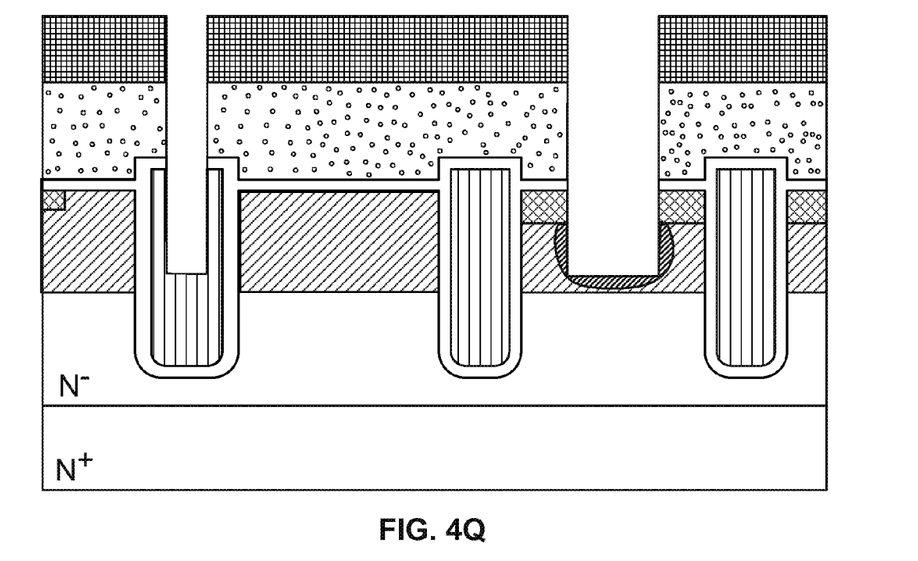
Figure 4R:
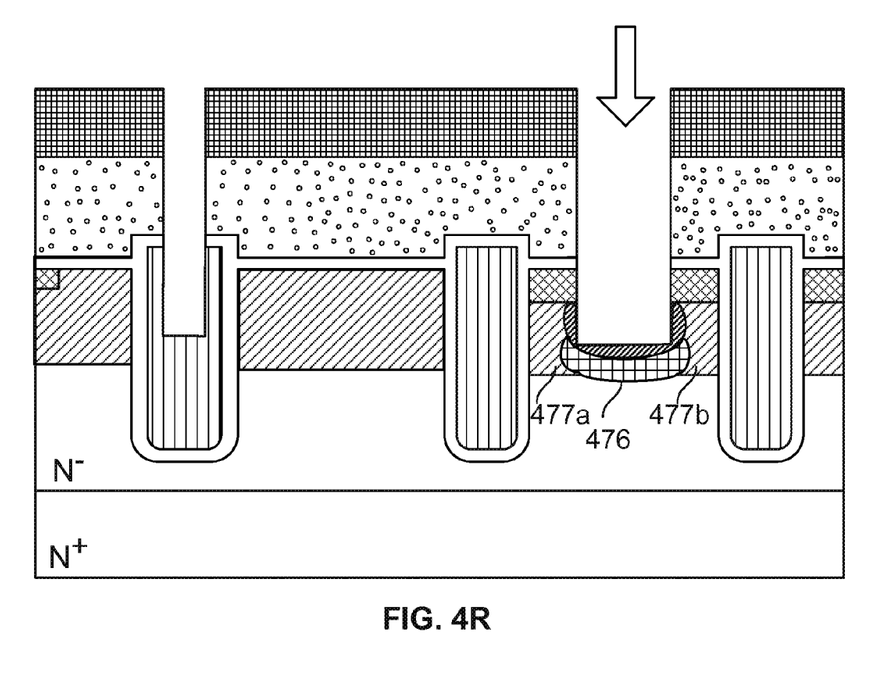

In FIG. 4Q, a second contact etch is performed. Depending on the desired changes to the diode forward voltage drop and the leakage current, some or all of the body contact implant in the bottom region of the trench is removed. In FIG. 4R, an epi enhancement layer 476 is implanted and thermally diffused. In one embodiment where the N-type epi has a carrier concentration of $2\times10^{16}$ ions/cm$^3$, phosphorous ions with an energy level of approximately 40 keV and dosage level of approximately $8\times10^{12}$ ions/cm$^2$ are implanted. The implant layer is thermally diffused at 1050° c. for 30 seconds. The resulting epi enhancement layer has a thickness of approximately 0.15-0.4 μm and a concentration of approximately $5\times10^{16}$-$3\times10^{17}$ ions/cm$^3$. Different thicknesses can be achieved by varying factors including the implant energy, dose and diffusion temperature. The trench depth and epi enhancement implants are arranged such that body regions 477a and 477b are separated in the bottom of the body region.

Alternatively, the second contact etch may be omitted. In some embodiments, after contact implant is carried out in step 4P, the epi enhancement implantation may be formed by using implants with different energy and dosage combination. While the body contact implants in the contact trench sidewalls remain unaffected, the body contact implants in the contact trench bottom may be completely compensated for the formation of Schottky diodes or partially compensated to leave a thin layer of diode enhancement layer for the formation of low injection diodes. In one embodiment, an implant of phosphor ions with $6\times10^{12}$ ions/cm$^2$ dose at 200 keV is carried out followed with a second implant of phosphor ions with $2\times10^{12}$ ions/cm$^2$ at 100 keV to compensate a portion of body contact implant and to form the epi enhancement layer.

Figure 4S:
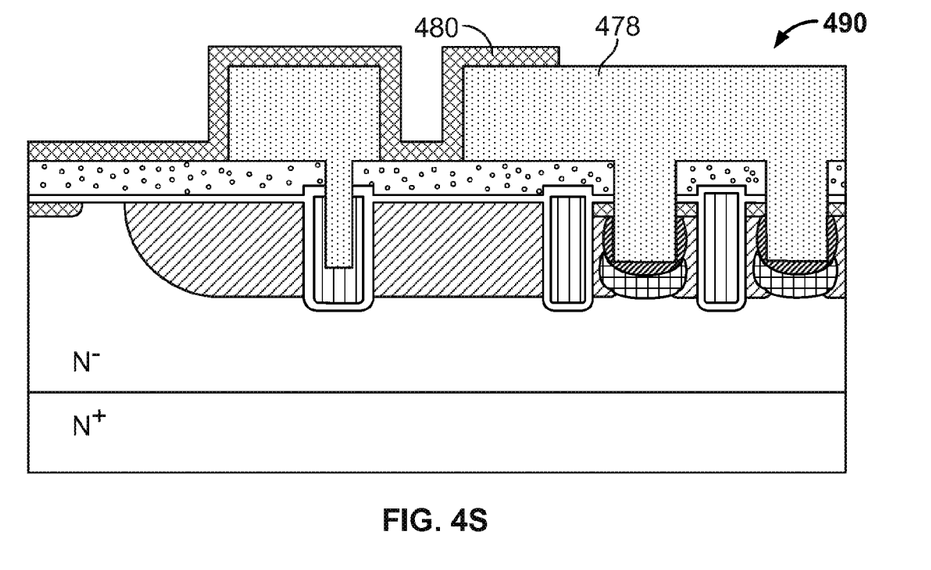

In FIG. 4S, completed device 490 is shown. Metal layer 478 is deposited, etched where appropriate, and annealed. Passivation openings are made after a passivation layer 480 is deposited. Additional steps required to complete the fabrication such as wafer grinding and back metal deposition are also performed.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:
1. A semiconductor device, comprising:
   a drain region;
   an epitaxial layer overlaying the drain region; and
   an active region comprising:
      a body disposed in the epitaxial layer;
      a source embedded in the body;
      a gate trench extending into the epitaxial layer;
      a gate disposed in the gate trench;
      a contact trench extending through the source and at least part of the body;
      a contact electrode disposed in the contact trench;
      an implant disposed at least in part along a bottom portion of the contact trench, the implant having opposite carrier type as the epitaxial layer; and
      an epitaxial enhancement portion formed below the implant and interfacing the implant.

2. The semiconductor device of claim 1, wherein the implant is further disposed along bottom of the contact trench to form a diode enhancement layer, and the epitaxial enhancement layer is disposed below the diode enhancement layer.

3. The semiconductor device of claim 1, wherein the implant is in direct contact with the contact electrode.

4. The semiconductor device of claim 1, wherein the diode enhancement layer is formed by a body contact implant that is in direct contact with the contact electrode.

5. The semiconductor device of claim 1, wherein the epitaxial enhancement portion has the same carrier type as the epitaxial layer.

6. The semiconductor device of claim 1, wherein the epitaxial enhancement portion and the implant have opposite carrier types.

7. The semiconductor device of claim 1, wherein the epitaxial enhancement portion is arranged to reduce breakdown voltage of a Schottky diode formed by the contact electrode and the drain.

8. The semiconductor device of claim 1, wherein the epitaxial enhancement portion has a higher carrier concentration than the epitaxial layer.

9. The semiconductor device of claim 1, wherein the active region further comprises a Shannon implant below the contact trench and above the epitaxial enhancement portion, and wherein the Shannon implant has opposite carrier type as the epitaxial layer.

10. The semiconductor device of claim 1, wherein the semiconductor device has a wall-to-wall pitch size that is less than or equal to 1.4 µm.

11. The semiconductor device of claim 1, wherein the epitaxial layer and the epitaxial enhancement portion are N-type.

12. The semiconductor device of claim 1, wherein the epitaxial layer and the epitaxial enhancement portion are P-type.

* * * * *